US008286037B2

(12) United States Patent
Lu et al.

(10) Patent No.: US 8,286,037 B2
(45) Date of Patent: Oct. 9, 2012

(54) METHOD AND DEVICE FOR ADJUSTING COMMUNICATIONS POWER

(75) Inventors: Yi-Sheng Lu, Chiayi (TW); Chih-Chieh Yen, Taipei County (TW); Chun-Chieh Huang, Taipei (TW); Jin-Jie Hung, Taipei County (TW)

(73) Assignee: Realtek Semiconductor Corp., Hsinchu (TW)

( * ) Notice: Subject to any disclaimer, the term of this patent is extended or adjusted under 35 U.S.C. 154(b) by 673 days.

(21) Appl. No.: 12/549,564

(22) Filed: Aug. 28, 2009

(65) Prior Publication Data

US 2010/0058148 A1 Mar. 4, 2010

(30) Foreign Application Priority Data

Aug. 29, 2008 (TW) ............................. 97133256 A

(51) Int. Cl.
*G06F 11/00* (2006.01)
*H04B 7/00* (2006.01)
*H03M 13/00* (2006.01)

(52) U.S. Cl. ......................... 714/704; 714/821; 455/522

(58) Field of Classification Search .................... 714/48, 714/51–52, 746, 798–799, 821, 704; 370/318; 455/522
See application file for complete search history.

(56) References Cited

U.S. PATENT DOCUMENTS 5,128,965 A * 7/1992 Henriksson .................. 375/285
6,035,209 A * 3/2000 Tiedemann et al. .......... 455/522
6,804,531 B2 * 10/2004 Komatsu ...................... 455/522
7,397,776 B2 7/2008 Maufer et al.
7,599,319 B2 * 10/2009 Kondou et al. .............. 370/318
7,643,443 B2 1/2010 Maufer et al.
2005/0101340 A1 5/2005 Archiable

FOREIGN PATENT DOCUMENTS

CN 1236231 11/1999
CN 1246995 3/2000
EP 0944201 A2 9/1999
JP H08-152946 6/1996
JP 2006-109094 4/2006
JP 2006-262177 9/2006

OTHER PUBLICATIONS

English Abstract for CN1236231A.
English Abstract for CN1246995A.
German language Office Action dated Apr. 14, 2010.
Shay Kutten, Hirotaka Ono, David Peleg, Kunihiko Sadakane, and Massafumi Yamashita. "Energy-Optimal Online Algorithms for Broadcasting in Wireless Networks." Proceedings of the Second Annual Conference on Wireless On-demand Network Systems and Services. IEEE. 2005, pp. 1 to 6.

* cited by examiner

*Primary Examiner* — Shelly A Chase
(74) *Attorney, Agent, or Firm* — Thomas, Kayden, Horstemeyer & Risley, LLP

(57) ABSTRACT

A method and device for adjusting communications power are used for detecting a communications condition between a connection port and a connection target, and a communications-supporting power of the connection port that includes at least one of a transmitting power and a receiving power is adjusted according to a detected communications condition. Therefore, accuracy of data transmission and reception is ensured, and power used for data transmission and reception is reduced.

19 Claims, 5 Drawing Sheets

METHOD AND DEVICE FOR ADJUSTING COMMUNICATIONS POWER

CROSS-REFERENCE TO RELATED APPLICATION

This application claims priority of Taiwanese application no. 097133256, filed on Aug. 29, 2008, the subject matter of which is incorporated herein by reference.

BACKGROUND OF THE INVENTION

1. Field of the Invention

This invention relates to a method and device for adjusting power, more particularly to a method and device for adjusting communications power.

2. Description of the Related Art

Current power-saving technology for wired network communications is deployed via network communications equipment of a computer based on a length of network cable used to connect the network communications equipment to a connection target. When the network cable used is short, power allotted for consumption by the network communications equipment is lower than that when the network cable used is long, thereby achieving power-saving and environmental protection goals.

Nevertheless, since a condition of the connection target influences the power allotted for consumption by the network communications equipment, and the condition of the connection target is not taken into account by the current power-saving technology, an error rate of data transmission can be high.

SUMMARY OF THE INVENTION

Therefore, an object of the present invention is to overcome the aforesaid drawback of the prior art.

Another object of the present invention is to provide a method and device for adjusting communications power capable of economizing communications power and ensuring quality of communications.

In an embodiment of the device for adjusting communications power according to the present invention, the device for adjusting communications power is realized in an integrated circuit implemented in a network switch. The device for adjusting communications power can also be implemented in a network card or other types of communications devices. The device for adjusting communications power can be realized using hardware, such as a combination of logic circuits, a combination of hardware and firmware, such as an assembly of a computing unit and a storage unit loaded with firmware, or a combination of hardware and software, such as a computer system provided with communications functionality.

The aforesaid network switch includes: a plurality of connection ports; a packet parser for receiving packets from the connection ports and parsing packet information; a reliable link error detector or detecting circuit (referred to hereinafter as the detector) for receiving packet information from the packet parser; and a power-saving controller for adjusting a communications-supporting power of the connection ports.

The method for adjusting communications power according to the present invention is performed by the detector and includes the following steps: presetting and storing first and second error rate threshold values ($R_L$), ($R_H$), wherein $R_L<R_H$; receiving packet information of packets received and transmitted by the connection ports and computing an error rate based on the packet information; determining whether the error rate is one of an error rate that is lower than $R_L$, an error rate that is higher than $R_H$, and an error rate that is neither lower than $R_L$ nor higher than $R_H$; generating an adjustment command for decreasing the communications-supporting power of the connection ports by one level when it is determined that the error rate is lower than $R_L$, wherein the communications-supporting power of the connection ports is at least one of a transmitting power and a receiving power; generating an adjustment command for increasing the communications-supporting power of the connection ports by one level when it is determined that the error rate is higher than $R_H$; and not generating an adjustment command so as to maintain a current level of the communications-supporting power of the connection ports when it is determined that the error rate is neither lower than $R_L$ nor higher than $R_H$.

In addition, when the detector determines that the error rate is lower than $R_L$ and detects that a level of the communications-supporting power of the connection ports is equal to a predetermined minimum level, the detector causes the power-saving controller to maintain the communications-supporting power of the connection ports at the predetermined level and not to cause further decrease of the communications-supporting power of the connection ports. When the detector determines that the error rate is higher than $R_H$ and detects that a level of the communications-supporting power of the connection ports is equal to a predetermined maximum level, the detector causes the power-saving controller to adjust the level of the communications-supporting power of the connection ports to a predetermined initial level. When the detector detects that the error rate transitions between a state wherein the error rate is lower than $R_L$ and a state wherein the error rate is higher than $R_H$, and a number of transitions within a predetermined time period reaches a predetermined value, a power-saving mechanism for decreasing the communications-supporting power of the connection ports is shut down, and the adjustment command for decreasing the communications-supporting power of the connection ports by one level is not sent to the power-saving controller.

The power-saving controller is coupled to the detector for adjusting the communications-supporting power of the connection ports according to the adjustment command received from the reliable link error detector.

When a network initialization operation is being performed, such as an initialization operation performed through Dynamic Host Configuration Protocol (DHCP) or Bootstrap protocol (BOOTP), the detector has detected the network initialization operation and has caused the power-saving controller to adjust a level of the communications-supporting power of the connection ports to a maximum level beforehand, and after the network initialization operation is finished, the detector causes the power-saving controller to readjust the level of the communications-supporting power of the connection ports to a predetermined initial level associated with a power-saving mode. After the network initialization operation is finished, during a connection-establishing stage, the detector generates an adjustment command for increasing the communications-supporting power of the connection ports by one level when a connection is established within (k) seconds, and a number of failures of the connection exceeds a predetermined value (n) within (m) seconds after the connection is established.

The detector computes an error rate based on packet transmission from the connection ports, computes an error rate based on packet reception by the connection ports, and generates corresponding ones of the adjustment commands accordingly. Alternatively, the detector can compute the error rate based solely on packet transmission from the connection ports, and cause the power-saving controller to adjust the transmitting power of the connection ports in accordance with the error rate, and the receiving power can be adjusted accordingly. Likewise, the detector can compute the error rate based solely on packet reception by the connection ports, and cause the power-saving controller to adjust the receiving power of the connection ports in accordance with the error rate, and the transmitting power can be adjusted accordingly.

The error rate is computed by the detector as a ratio of an error count to a packet count, the error count being incremented in response to reception of packet information that indicates a packet transmission error, the packet count being incremented in response to packet reception. When the detector detects that the packet count reaches a predetermined maximum value, one of the following is performed: the packet count and the error count are divided by a same number; and the packet count and the error count are reset to zero. When the detector determines that a received packet has a request/acknowledgement characteristic, the packet count is incremented by one, and the packet information of the received packet is recorded, wherein the packet information includes addresses and port numbers of source and destination ends, and a key sequence number. A transmission direction can be determined from the packet information.

When the detector determines that there is recorded packet information, and a packet is received, the packet information of the latest received packet is compared to the recorded packet information so as to determine whether packet retransmission has occurred. With regard to a Transmission Control/Internet Protocol (TCP/IP) packet, when the detector compares the recorded packet information to the packet information of the latest received packet, the detector determines whether the addresses and the port numbers of the source and destination ends conform, and determines a relationship between one of an acknowledgement sequence number and a packet sequence number of the packet information of the latest received packet and the key sequence number of the recorded packet information. When the detector determines that the transmission direction of the latest received packet is the same as the transmission direction indicated by the recorded packet information, the packet sequence number of the latest received packet is compared with the key sequence number of the recorded packet information. When the detector determines that the packet sequence number and the key sequence number that are being compared are equal, then the detector concludes that packet retransmission has occurred. When the detector determines that the transmission direction of the latest received packet is opposite to that of the transmission direction indicated by the recorded packet information, the acknowledgement sequence number of the latest received packet is compared with the key sequence number of the recorded packet information. When the detector determines that the acknowledgement sequence number is not greater than the key sequence number, then the detector determines that packet retransmission has occurred. When it is determined that packet retransmission has occurred, the error count is incremented by one and the recorded packet information is deleted.

With regard to an Internet Control Message Protocol (ICMP) packet, when the reliable link error detector determines that a received packet has a request/acknowledgement characteristic, the reliable link error detector determines whether an acknowledgement for a transmitted packet is received within a predetermined time period, and if the acknowledgment is not received within the predetermined time period, the error count is incremented by one.

When a received packet has a code used for error detection, the detector uses the code to determine whether the received packet is damaged, and a rate of damage is used as the error rate.

The following detailed description of the preferred embodiment explains more clearly how the present invention is realized, and how effects attributable thereto are achieved.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OP THE PREFERRED EMBODIMENT

Figure 1:
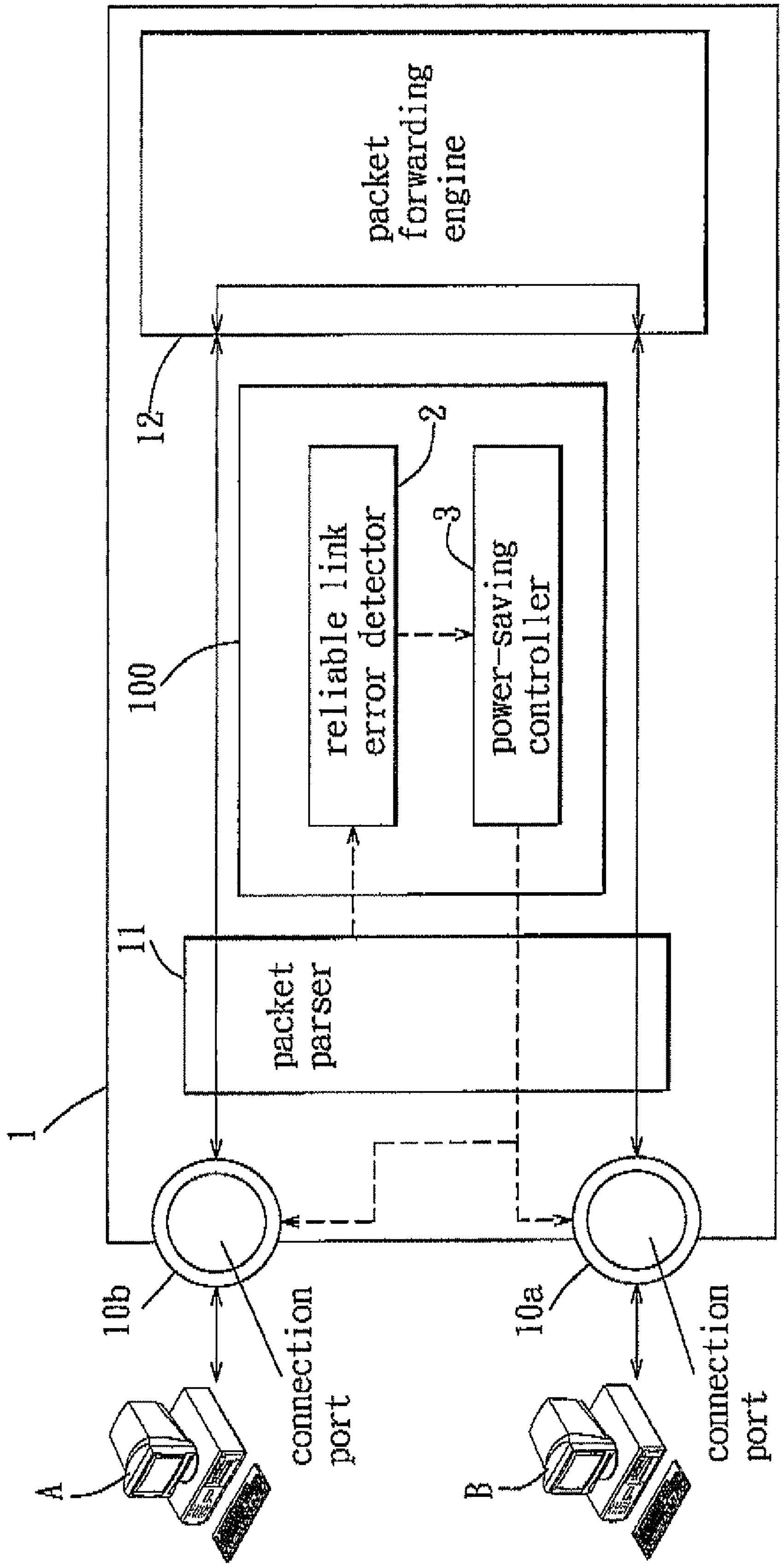
FIG. 1 is a schematic circuit block diagram of a preferred embodiment of a device for adjusting communications power according to the present invention.

FIG. 1 illustrates the preferred embodiment of a device 100 for adjusting communications power according to the present invention. In this embodiment, the device 100 for adjusting communications power is realized in an integrated circuit that is implemented in an Ethernet network switch 1. The network switch 1 includes a packet parser 11, a packet forwarding engine 12, and connection ports 10*a* and 10*b* for connection to connection targets (B) and (A), respectively. In this embodiment, the connection targets (B), (A) are computers. The network switch 1 transmits packets from the connection target (B) through the connection port 10*a* to the connection port 10*b*, then onward to the connection target (A). Likewise, the network switch 1 transmits packets from the connection target (A) through the connection port 10*b* to the connection port 10*a*, then onward to the connection target (B).

In this embodiment, the device 100 for adjusting communications power performs the method for adjusting communications power of the present invention through a layer of the International Standards Organization (ISO) network model that has protocols with packet error detection and control characteristics, such as a data link layer or a transport layer. In this embodiment, the layer having the protocols with packet error detection and control characteristics causes a physical layer to adjust power consumed thereby, such as a working electrical current or voltage of a circuit.

The device 100 for adjusting communications power includes a reliable link error detector or detecting circuit 2 (referred to hereinafter as the detector) and a power-saving controller 3 for adjusting power consumption of the physical layer. It should be noted that the device 100 for adjusting communications power can be implemented by hardware, such as an assembly of logic circuits, or by a combination of hardware and firmware, such as an assembly including a computing unit and a storage unit loaded with firmware. Those skilled in the art can select an appropriate implementation of the device 100 for adjusting communications power based on what is disclosed herein. In another preferred embodiment according to the present invention, the device 100 for adjusting communications power is implemented by a computer program, which is loaded and executed by an operating system of a computer for controlling the power consumption of a communications device coupled to the computer.

The packet parser 11 of the network switch 1 parses each field of a header of each incoming packet. Each of the fields is a parameter such as a flag, a source address, a destination address, or a protocol type. The packet parser 11 then sends the parameters to the detector 2 of the device 100 for adjusting communications power.

The packet-forwarding engine 12 is responsible for determining packet routes and performing transmission tasks for normal packets. The packet parser 11, the packet-forwarding engine 12, and essential circuitry of the network switch 1 (not shown in FIG. 1) are known in the prior art, and thus will not be further detailed herein so as to retain focus on the device 100 for adjusting communications power according to the present invention.

The detector 2 is for detecting over a period of time a quality of data transmission and reception between the connection targets (A), (B) through analyzing each of the parameters received from the packet parser 11 to determine whether a transmission error, such as packet loss, has occurred, and determining accordingly whether a predetermined condition for adjusting a communications-supporting power of the connection ports 10*a*, 10*b* has been met. The communications-supporting power is a level of power at which the connection ports 10*a*, 10*b* support data transmission and/or data reception, and therefore includes at least one of a transmitting power that supports data transmission and a receiving power that supports data reception. When it is determined that the predetermined condition for adjusting the communications-supporting power of the connection ports 10*a*, 10*b* has been met, the detector 2 generates an adjustment command that is transmitted to the power-saving controller 3. The power-saving controller 3 then adjusts the communications-supporting power of the connection ports 10*a*, 10*b* in accordance with the adjustment command.

The manner in which the detector 2 of the preferred embodiment determines whether the transmission error has occurred, and whether the predetermined condition for adjusting the communications-supporting power has been met, as well as the manner in which the power-saving controller 3 adjusts the communications-supporting power of the connection ports 10*a*, 10*b*, are described below with reference to the accompanying Figures. In this embodiment, the device 100 for adjusting communications power detects data transmitted from and received by the connection port 10*a* on behalf of the connection target (B), determines the transmission errors thereof, and adjusts the communications-supporting power of the connection port 10*a*.

Figure 2:
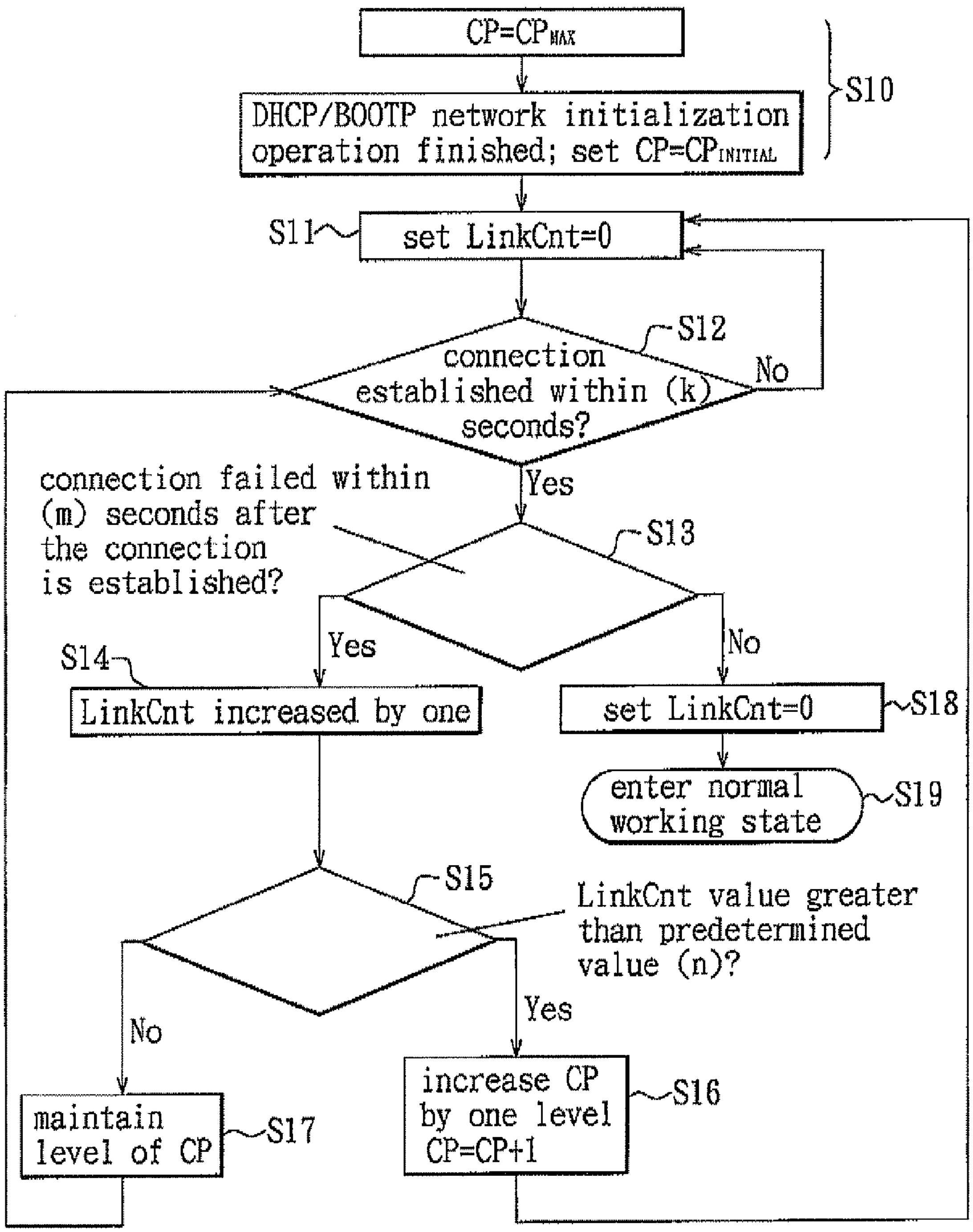
FIG. 2 is a flowchart of a connection-establishing stage of a preferred embodiment of a method for adjusting communications power according to the present invention.

Referring to FIG. 2, when a power-saving mode of the device 100 for adjusting communications power is activated, in order to prevent a connection between the connection port 10*a* and the connection target (B) from failing or becoming unstable (that is, transitioning between an 'up' link state and a 'down' link state repeatedly) due to insufficient power supply, the device 100 for adjusting communications power first performs steps S10 through S19 to adjust the communications-supporting power of the connection port 10*a* so as to ensure stability of the connection between the connection port 10*a* and the connection target (B).

In step S10, when the detector 2 detects that a network initialization operation is being performed between the connection targets (A), (B), such as acquisition of an IP address and/or subnet mask through Dynamic Host Configuration Protocol (DHCP) or Bootstrap Protocol (BOOTP), the detector 2 has caused the power-saving controller 3 to adjust a level of the communications-supporting power (CP) of the connection port 10*a* to a maximum level ($CP_{MAX}$) beforehand so as prevent connection failure or instability due to insufficient power supply or power adjustments. The maximum level ($CP_{MAX}$) can be a maximum value of a working electrical current or working voltage of the connection port 10*a*. After the network initialization operation is finished, the detector 2 causes the power-saving controller 3 to readjust the level of the communications-supporting power (CP) of the connection port 10*a* to a predetermined initial level ($CP_{inital}$) of the power-saving mode, and the flow proceeds to step S11.

The predetermined initial level ($CP_{initial}$) of the communications-supporting (CP) power of the connection port 10*a* is one determined in accordance with characteristics of the physical layer, such as a level of power at which the physical layer functions normally, and can be implemented by those skilled in the art according to what is disclosed herein. It should be noted that step S10 can be omitted when the network initialization operation is not necessary, and the level of the communications-supporting power (CP) of the connection port 10*a* is equal to the predetermined initial level ($CP_{initial}$).

In step S11, the detector 2 sets a value of a link count (LinkCnt) to zero.

In step S12, the detector 2 determines whether the connection between the connection port 10*a* and the connection target (B) is established within (k) seconds (e.g., sixty seconds). When the connection is established within (k) seconds, the flow proceeds to step S13. When the connection is not established within (k) seconds, it can indicate that a network cable has not yet been connected, a condition under which there is no need for the network initialization operation, and the flow thus returns to step S11. On the other hand, when the connection is not established within (k) seconds and the network initialization operation is necessary, it can indicate that the predetermined initial level ($CP_{initial}$) of the communications-supporting power of the connection port 10*a* is too low, and the detector 2 can, in response, cause the power-saving controller 3 to increase the predetermined initial level ($CP_{initial}$) of the communications-supporting power (CP) of the connection port 10*a* by one level (not shown in FIG. 2). The flow then returns to step S12, wherein the detector 2 detects whether the connection between the connection port 10*a* and the connection target (B) is established within a subsequent (k) seconds. If the connection is established within the subsequent (k) seconds, the flow proceeds to step S13. Otherwise, the initial level ($CP_{initial}$) of the communications-supporting power (CP) of the connection port 10*a* is again increased by one level, and the above-described procedure may be repeated until the initial level ($CP_{INITIAL}$) of the communications-supporting power (CP) of the connection port 10*a* is adjusted to be equal to the maximum level ($CP_{MAX}$).

In step S13, the detector 2 determines whether the connection between the connection port 10*a* and the connection target (B) fails within (m) seconds (e.g., thirty seconds) after the connection has been established. When the connection fails within (m) seconds after the connection has been established, it indicates that the connection is possibly unstable, and the flow thus proceeds to step S14. Otherwise, the connection is considered stable, and the flow thus proceeds to step S18.

In step S14, the detector 2 increases the link count (LinkCnt) by one.

In step S15, the detector 2 determines whether the link count (LinkCnt) is greater than a predetermined value (n). When the link count (LinkCnt) is greater than the predetermined value (n), it indicates that the connection between the connection port 10*a* and the connection target (B) is unstable, and the flow thus proceeds to step S16. On the other hand, when the link count (LinkCnt) is less than the predetermined value (n), it indicates that failure of the connection after the connection has been established can be an isolated event requiring further observation, and thus the flow proceeds to step S17.

In step S16, the detector 2 causes the power-saving controller 3 to increase the communications-supporting power (CP) of the connection port 10*a* by one level, and the flow returns to step S11 for determining in subsequent steps whether an increased level of the communications-supporting power (CP) of the connection port 10*a* is sufficient for establishing and sustaining the connection.

In step S17, the detector 2 causes the power-saving controller 3 to maintain a current level of the communications-supporting power (CP) of the connection port 10*a*, and the flow returns to step S12 for determining whether the current level of the communications-supporting power (CP) of the connection port 10*a* is sufficient for establishing and sustaining the connection.

In step S18, the detector 2, having determined in step S13 that the connection between the connection port 10*a* and the connection target (B) has not failed within (m) seconds after the connection has been established, sets the link count (LinkCnt) to zero.

In step S19, a normal working state is entered, and a reliable connection flow or data flow is established between the connection port 10*a* and the connection target (B).

Referring to FIG. 3 and again to FIG. 1, after the data flow is established between the connection port 10*a* and the connection target (B), and the normal working state is entered, the device 100 for adjusting communications power is tasked with determining whether the communications-supporting power of the connection port 10*a* of the network switch 1 supports effective transmission and reception of packets so as to enable the connection target (B) to receive and to transmit packets effectively, as well as with adjusting the communications-supporting power of the connection port 10*a* accordingly when it is determined that the predetermined condition for adjusting the communications-supporting power has been met.

The detector 2 of this embodiment is configured to sample continuously and at random the data flow. However, in another embodiment of the present invention, the detector 2 can be configured to detect all packets in the data flow as long as computing speed permits. In the following description of the method for adjusting communications power of the present invention as performed by the device 100 for adjusting communications power, packet transmission from the connection port 10*a* will be referenced by the detector 2 in determining whether to adjust the transmitting power of the connection port 10*a*.

In step S21, the power-saving controller 3 determines an initial level ($CP_{INITIAL}$) of the transmitting power of the connection port 10*a*. The initial level ($CP_{INITIAL}$) of the transmitting power (CP) is equal to a level of the communications-supporting power of the connection port 10*a* at which the flow enters the normal working state, as shown in step S19 of FIG. 2.

In step S22, the detector 2 detects the data transmitted from the connection port 10*a* on behalf of the connection target (B), that is, the data flow, and computes an error rate. In order to compute the error rate, the detector 2 determines whether a packet is one having a request/acknowledgement characteristic, such as a Transmission Control Protocol/Internet Protocol (TCP/IP) packet, an Address Resolution Protocol (ARP) packet, or an Internet Control Message Protocol (ICMP) packet. If the packet has the request/acknowledgement characteristic, then packet information of the packet is confirmed, and the detector 2 determines whether the connection target (B) receives the packet transmitted from the connection port 10*a*. If the detector 2 determines that packet loss has occurred, then an error count is increased by one, thereby increasing the error rate. Computation of the error rate will be explained in greater detail in the succeeding paragraphs with reference to FIG. 4.

In step S23, after the error rate is computed, the detector 2 determines whether the error rate is lower than a predetermined minimum threshold value ($R_L$), such as three errors per one hundred thousand transmitted packets. When the error rate is lower than $R_L$, it indicates that transmission of packets is effectively supported, and the flow proceeds to step S24. Otherwise, the flow proceeds to a right side of the flowchart of FIG. 3 (steps S26-S29) that begins with step S26, wherein the detector 2 determines whether the error rate is higher than a predetermined maximum threshold value ($R_H$), such as ten errors per one hundred thousand transmitted packets.

In step S24, the detector 2 determines whether a level of the transmitting power (CP) of the connection port 10*a* is equal to a predetermined minimum level ($CP_{Min}$). When the detector 2 determines that the transmitting power (CP) of the connection port 10*a* is equal to the predetermined minimum level ($CP_{Min}$), the flow proceeds to step S241. Otherwise, the flow proceeds to step S25.

In step S241, the detector 2 causes the power-saving controller 3 to maintain the transmitting power (CP) of the connection port 10*a* at the predetermined minimum level ($CP_{Min}$) and not to cause further decrease of the transmitting power (CP) of the connection port 10*a*. The flow then returns to step S22, wherein the detector 2 continues to detect the data flow and compute the error rate thereof. In this embodiment, the predetermined minimum level ($CP_{Min}$) is a lowest level of power supporting normal function of the physical layer. However, the predetermined minimum level ($CP_{Min}$) is not limited to what is disclosed herein.

In step S25, the detector 2, having determined in step 323 that the error rate is lower than $R_L$, and having determined in step S24 that the level of the transmitting power (CP) of the connection port 10*a* is not equal to the predetermined minimum level ($CP_{Min}$), generates an adjustment command that causes the power-saving controller 3 to decrease the transmitting power (CP) of the connection port 10*a* by one level. In practice, the one level by which the transmitting power (CP) of the connection port 10*a* is adjusted is predetermined in the physical layer. The flow then returns to step S22, wherein the detector 2 continues to detect the data flow and compute the error rate thereof.

Figure 3:
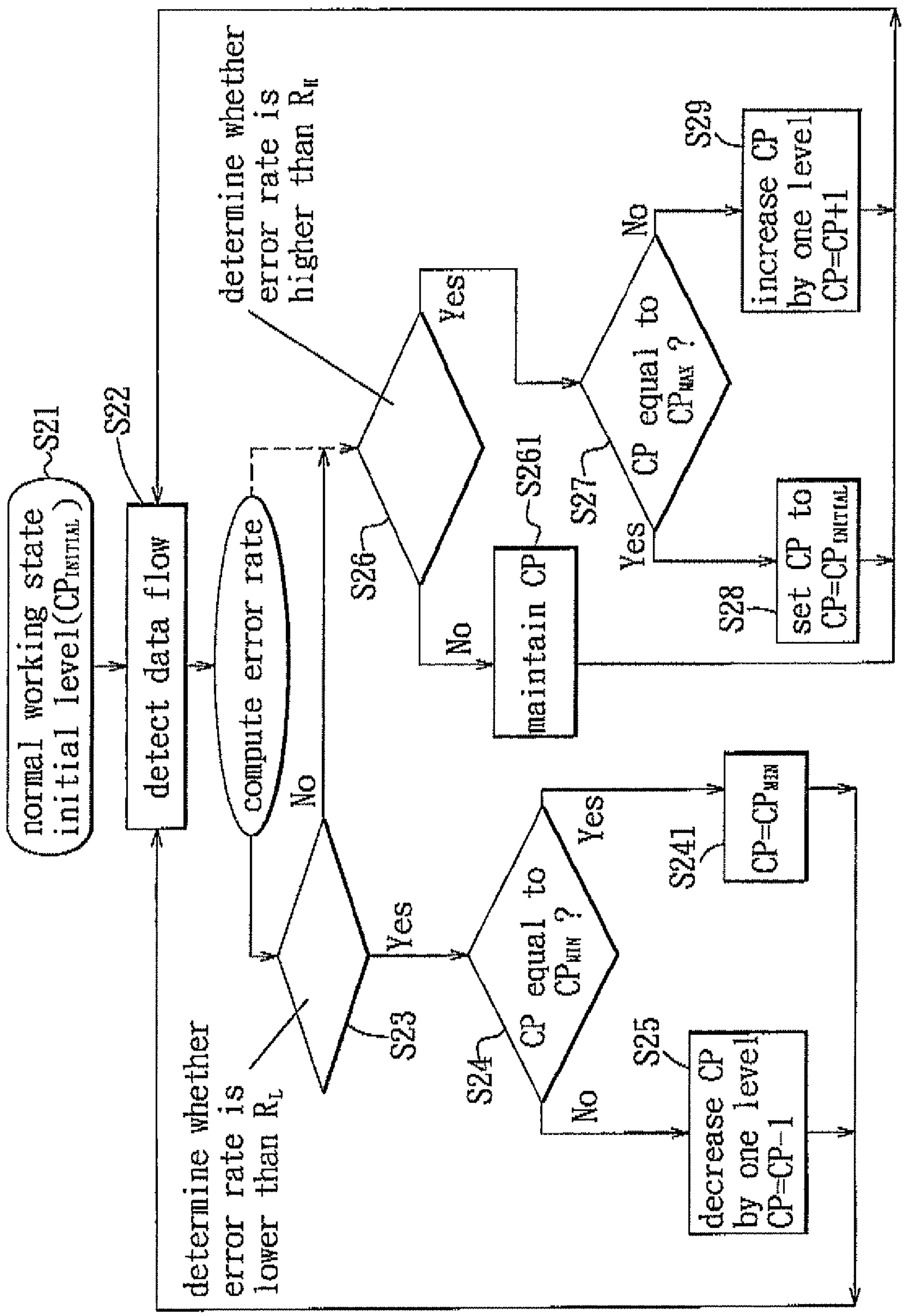
FIG. 3 is a flowchart of the preferred embodiment of the method for adjusting communications power, illustrating adjustment of a communications-supporting power of a connection port of a network switch.

As previously mentioned, when it is determined in step S23 that the error rate is not lower than $R_L$, the flow proceeds to step S26 of the right side of the flowchart of FIG. 3 for determining whether the error rate is higher than the predetermined maximum threshold value $R_H$.

In step S26, the detector 2 determines whether the error rate is higher than the maximum threshold value $R_H$. When the detector 2 determines that the error rate is higher than $R_H$, it indicates that packet transmission is not effectively supported, and the flow thus proceeds to step S27. Otherwise, the detector 2 concludes that the error rate is neither lower than $R_L$ nor higher than $R_H$, and the flow thus proceeds to step S261.

In step S261, the detector 2 generates no adjustment command, and thus a current level of the transmitting power (CP) of the connection port 10*a* is maintained. The flow then returns to step S22, wherein the detector 2 continues to detect the data flow and computes the error rate thereof.

In step S27, the detector 2, having determined in step S26 that the error rate is higher than $R_H$, determines whether a level of the transmitting power (CP) of the connection port 10*a* is equal to a predetermined maximum level ($CP_{Max}$). When the detector 2 determines that the level of the transmitting power (CP) of the connection port 10*a* is equal to the predetermined maximum level ($CP_{Max}$), it indicates that the error rate is unrelated to the level of the transmitting power (CP), and the flow thus proceeds to step S28. Otherwise, the flow proceeds to step S29. In this embodiment, the predetermined maximum level ($CP_{Max}$) is determined through testing or specifications of actual circuits, or by empirical rule. Theoretically, the level of the transmitting power (CP) necessary for successful transmission and reception of packets is not higher than the predetermined maximum level ($CP_{Max}$). However, the manner in which the predetermined maximum level ($CP_{Max}$) is determined is not limited to what is disclosed herein.

In step S28, the detector 2 causes the power-saving controller 3 to adjust the level of the transmitting power (CP) of the connection port 10*a* back to the initial level ($CP_{INITIAL}$), and the flow subsequently returns to step S22, wherein the detector 2 continues to detect the data flow and computes the error rate thereof.

In step S29, the detector 2, having determined in step S26 that the error rate is higher than $R_H$, and having determined in step S27 that the level of the transmitting power is not equal to the predetermined maximum level ($CP_{MAX}$), generates an adjustment command that causes the power-saving controller 3 to increase the level of the transmitting power (CP) of the connection port 10*a* by one level. The flow then returns step S22, wherein the detector 2 continues to detect the data flow and computes the error rate thereof.

In the method of the present invention, a relationship of the error rate to the minimum and maximum predetermined threshold values ($R_L$), ($R_H$) directs the path of the flow to one of the right and left sides of the flowchart of FIG. 3, the left side adjusting the level of the communications-supporting power when the predetermined condition permits decrease thereof and the right side adjusting the level of the communications-supporting power when the predetermined condition permits increase thereof. In this manner, a mechanism for automatic adjustment of communications power is realized. Although in this embodiment, the relationship of the error rate to the minimum predetermined threshold value ($R_L$) is determined first, in practice, the relationship of the error rate to the maximum predetermined threshold value ($R_H$) can be determined first, as indicated by the broken line in FIG. 3.

In addition, when the detector 2 detects that the error rate transitions between a state wherein the error rate is lower than $R_L$ and a state wherein the error rate is higher than $R_H$, a number of transitions can be counted. When the number of such transitions within a predetermined time period reaches a predetermined value, the device 100 for adjusting communications power can shut down a power-saving mechanism for decreasing the communications-supporting power of the connection port 10*a* that is represented in the left side of the flowchart of FIG. 3. The adjustment command for decreasing the communications-supporting power of the connection port 10*a* by one level is thus not sent to the power-saving controller 3.

Figure 4:
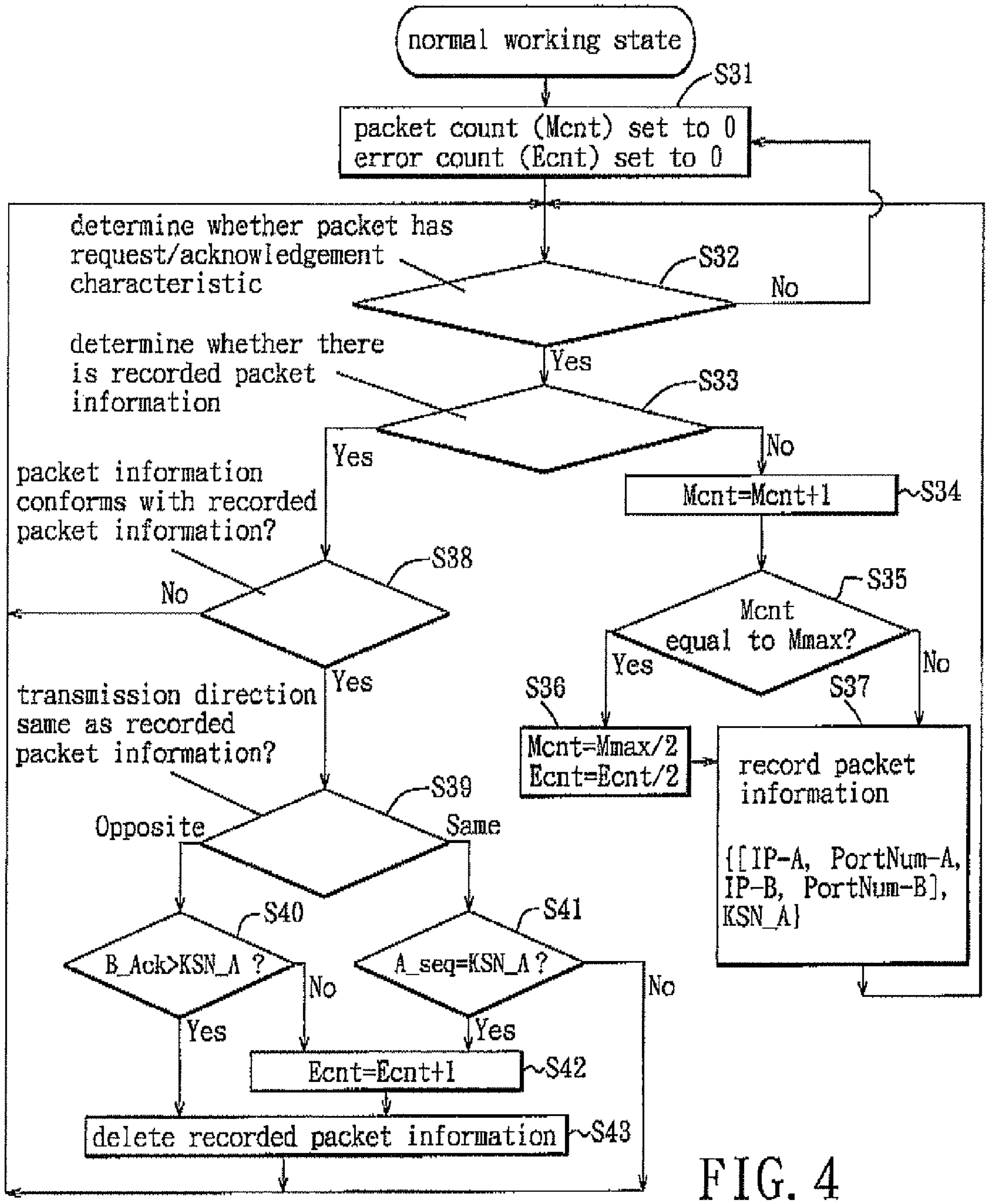
FIG. 4 a flowchart to illustrate computation of an error rate that is used in the method of FIG. 3 based on packet transmission from the connection port that is used in FIG. 3.
Figure 5:
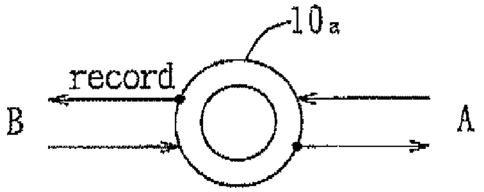
FIG. 5 is a schematic diagram to illustrate packet transmission from the connection port on behalf a connection target.

FIGS. 4 and 5 illustrate computation of the error rate that is used in the method shown in FIG. 3. FIG. 4 illustrates computation of the error rate based on TCP/IP packet transmission from the connection port 10*a*. FIG. 5 illustrates that packet transmission from the connection port 10*a* includes transmission of packets from the connection port 10*a* to the connection target (B), and from the connection port 10*a* to the connection port 10*b*, destined for the connection target (A) (see FIG. 1). It should be noted that when the connection ports 10*a*, 10*b* transmit (and receive) packets, a register of the network switch 1 (not shown in the Figures) records the packet information.

In step S31, the normal working state has been entered, and the detector 2 sets a packet count (Mcnt) to zero and an error count (Ecnt) to zero, and a timer starts. The flow then proceeds to step S32.

In step S32, the detector 2 determines whether a received packet has a request/acknowledgement characteristic. If the received packet has the request/acknowledgement characteristic, then the received packet can be handled by this embodiment, and the flow proceeds to step S33. Otherwise, the received packet is ignored, and the flow returns to step S31.

In step 33, the detector 2 determines whether there is recorded packet information for a packet transmitted from the connection port 10*a* to the connection target (B). When it is determined that there is recorded packet information, the flow proceeds to step S38, which is the first step in a left side of the flowchart of FIG. 4 (steps S38 to S43) for determining whether transmission error has occurred. Otherwise, the flow proceeds to step S34, which is the first step in a right side of the flowchart of FIG. 4 (steps S34 to S37) for recording packet information.

In step S34, the detector 2 increases the packet count (Mcnt) by one and the timer is reset to 0. The flow then proceeds to step S35.

In step S35, the detector 2 determines whether the packet count (Mcnt) is equal to a predetermined maximum packet count (Mmax). When the packet count (Mcnt) is equal to the predetermined maximum packet count (Mmax), the flow proceeds to step S36. Otherwise, the flow proceeds to step S37.

In step S36, the packet count (Mcnt) and the error count (Ecnt) are divided by a same number, which in this case is two. This step ensures that the ratio of the packet count (Mcnt) to the error count (Ecnt) can be computed continuously. Alternatively, the packet count (Mcnt) and the error count (Ecnt) can be reset to zero. The flow then proceeds to step S37.

in step S37, the packet information of the received packet is recorded. The recorded packet information includes addresses and port numbers of source and destination ends, and a key sequence number. The packet information applicable to computing the error rate based on packet transmission from the connection port 10*a* includes '{[IP-A, PortNum-A, IP-B, PortNum-B], KSN-A}', wherein the packet information indicates a transmission direction from the connection target (A) to the connection target (B). After the packet information has been recorded, the detector 2 acknowledges that the packet information has been recorded when a next packet is received.

In step S38, the detector 2, having determined in step S33 that there is the recorded packet information, determines whether the addresses and the port numbers of the source and destination ends of the recorded packet information and the packet information of a latest received packet conform. If the addresses and the port numbers of the source and destination ends conform, then the latest received packet is one that has been transmitted between the connection port 10*a* and the connection target (B), and the flow proceeds to step S39. Otherwise, the latest received packet is one transmitted through another connection and is thus ignored, and the flow returns to step S32.

In step S39, the detector 2 determines whether the transmission direction of the latest received packet is the same as the transmission direction indicated by the recorded packet information. If the transmission direction of the latest received packet is the same as the transmission direction indicated by the recorded packet information, that is, from the connection target (A) to the connection target (B), and therefore from the connection port 10*a* to the connection target (B), the flow proceeds to step S41. Otherwise, the latest received packet is one transmitted in response from the connection target (B) to the connection port 10*a* and destined for the connection target (A), and the flow thus proceeds to step S40.

In step 340, the detector 2 compares an acknowledgement sequence number (B_Ack) of the latest received packet to the key sequence number (KSN_A) of the recorded packet information, wherein the key sequence number (KSN_A) is a packet sequence number (A_seq) of a packet previously transmitted from the connection port 10*b* to the connection port 10*a*, destined for the connection target (B).

For instance, the register of the network switch 1 can have one entry of the recorded packet information of 'KSN_A, A_ack=100,20', and the packet information of the latest received packet can indicate the transmission direction from the connection target (B) to the connection target (A), and include the packet sequence number (B_seq) and the acknowledgement sequence number (B_ack). In this step, the detector 2 determines whether the acknowledgement sequence number (B_ack) of the latest received packet is greater than the key sequence number (KSN_A) of the recorded packet information. If the detector 2 determines that the acknowledgement sequence number (B_ack) of the latest received packet is greater than the key sequence number (KSN_A) of the recorded packet information, for example, if the packet information of the latest received packet includes 'B_seq, B_ack=20,101', then the latest received packet is one that is successfully transmitted, and the connection port 10*a* effectively supports packet transmission. The connection target (B), in an acknowledgement packet, then requests that the connection port 10*a* transmit a next packet, and the flow further proceeds to step S43.

If the detector 2 determines that the acknowledgement sequence number (B_Ack) of the latest received packet is not greater than the key sequence number (KSN_A) of the recorded packet information, for example, if the packet information of the latest received packet includes 'B_seq, B_ack=20,99', then the connection target (B) has not yet received the packet transmitted from the connection port 10*a* that has the key sequence number (KSN_A), and the connection target (B) then requests that the connection port 10*a* retransmit the packet, and the flow proceeds to step S42.

In step S41, the detector 2, having determined in step S39 that the transmission direction of the latest received packet is the same as the transmission direction indicated by the recorded packet information, compares the packet sequence number (A_seq) of the latest received packet to the key sequence number (KSN_A) of the recorded packet information. If the detector 2 determines that the packet sequence number (A_seq) of the latest received packet is equal to the key sequence number (KSN_A) of the recorded packet information, the detector 2 concludes that packet retransmission has occurred, and the flow thus proceeds to step S42. Otherwise, the packet is simply another one that is transmitted from the connection port 10*a* to the connection target (B), and is ignored. The flow then returns to step S32.

In step S42, the detector 2 increases the error count (Ecnt) by one. The flow then proceeds to step S43.

In step S43, the recorded packet information is deleted, and the flow returns to step S32.

The foregoing steps S34 and S42 affect computation of the error rate that is based on the error count (Ecnt) and the packet count (Mcnt), and that is provided to the device 100 for adjusting communications power for use in the normal working state after step S22, as shown in FIG. 3.

In this embodiment, the error rate is a ratio of the error count (Ecnt) to the packet count (Mcnt) that requires continuous computation. However, step S36, which enables continuous computation of the ratio of the error count (Ecnt) to the packet count (Mcnt), can be omitted by presetting a threshold value for the error count (Ecnt), and causing the threshold value to change in accordance with an accumulated amount. For instance, the aforementioned $R_L$ is initially set to three errors per one hundred thousand packets transmitted, so that when the error count (Ecnt) is equal to three before the packet count (Mcnt) is equal to one hundred thousand, $R_L$ has been reached. However, when the packet count (Mcnt) is greater than one hundred thousand and less than two hundred thousand, the error rate can reach $R_L$ when the error count (Ecnt) is equal to six. Alternatively, an error frequency can be used, and an error frequency threshold value can be preset so as to determine the quality of data transmission. When the packet count (Mcnt) reaches the predetermined maximum value (Mmax), both the error count (Ecnt) and the packet count (Mcnt) are reset to zero.

In addition, computing the error rate based solely on packet transmission from the connection port 10*a*, and adjusting the transmitting power of the connection port 10*a* in accordance with the error rate, as described previously, are performed under the assumption that the connection port 10*a* effectively receives packets. The rationale for the above is that a case may present where the transmitting power of the connection port 10*a* effectively supports packet transmission, but the receiving power of the connection port 10*a* does not effectively support packet reception. Computing the error rate based solely on packet transmission thus leads to an erroneous determination that the transmitting power of the connection port 10*a* does not effectively support packet transmission, and consequently, futile adjustment of the transmitting power is performed. To avoid the aforesaid problem, the receiving power can be adjusted at the same time as the transmitting power. Alternatively, the error rate can be computed for both packet transmission and packet reception of the connection port 10*a*, and adjustments of the transmitting power and the receiving power of the connection port 10*a* can be performed accordingly.

Figure 6:
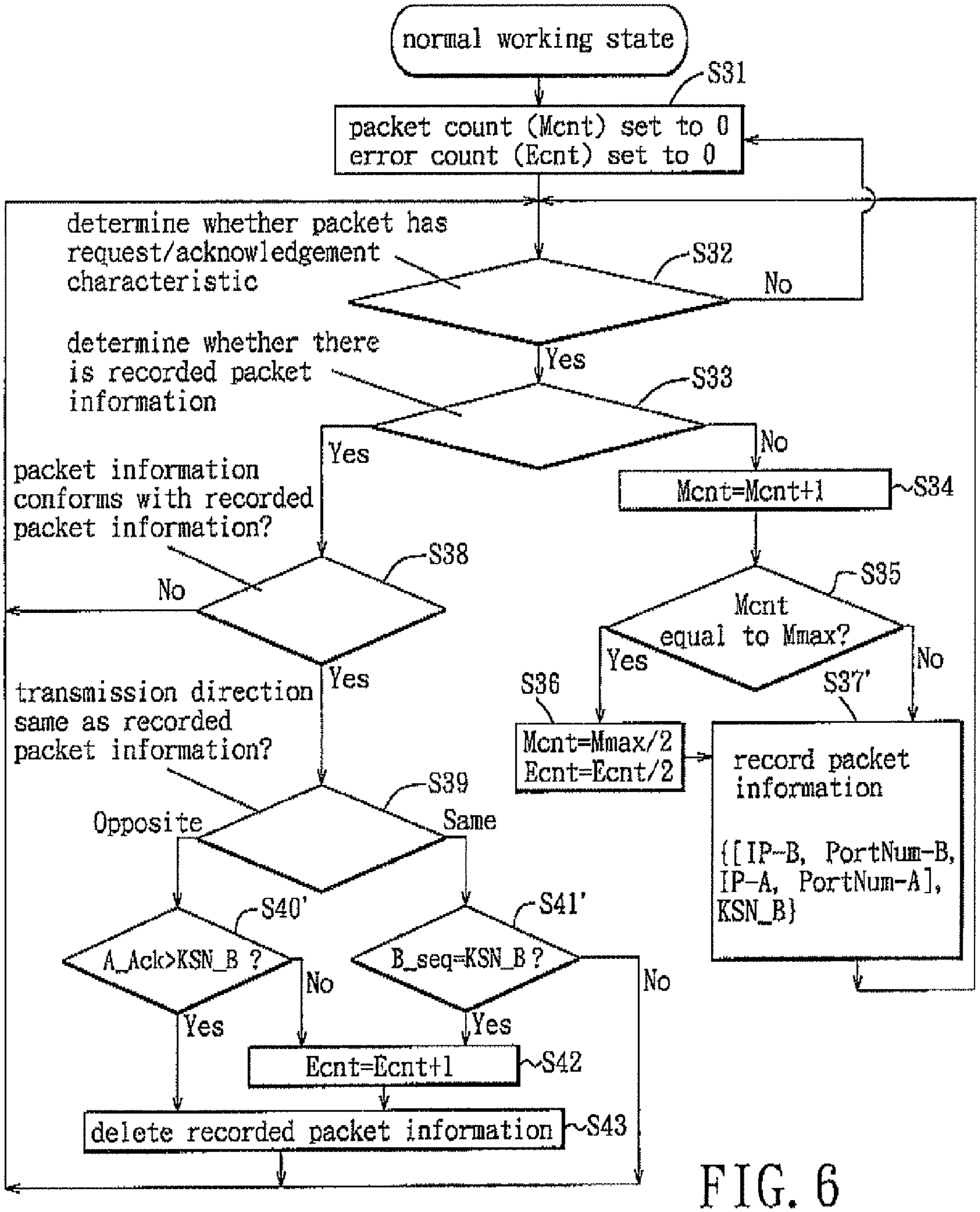
FIG. 6 is a flowchart to illustrate computation of the error rate that is used in the method of FIG. 3 based on packet reception by the connection port.
Figure 7:
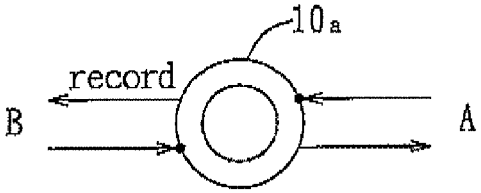
FIG. 7 is a schematic diagram to illustrate packet reception by the connection port on behalf of the connection target.

Referring again to FIG. 1 and further to FIGS. 6 and 7, the error rate is computed based on packet reception by the connection port 10*a*. The flow thereof is nearly identical to computation of the error rate based on packet transmission from the connection port 10*a* as shown in FIG. 4, with the exception that the packet information applicable to computing the error rate based on packet reception is different, and thus the recorded packet information is different.

The packet information recorded in step S37' includes '{[IP-B, PortNum-B, IP-A, PortNum-A], KSN-B}', wherein the transmission direction indicated thereby is from the connection target (B) to the connection target (A).

In step S40', the detector 2 determines whether the acknowledgement sequence number (A_ack) of the latest received packet is greater than the key sequence number (KSN_B) of the recorded packet information.

In step S41', the detector 2 determines whether the packet sequence number (B_seq) of the latest received packet is equal to the key sequence number (KSN_B) of the recorded packet information.

It should be noted that computation of the error rate based on packet reception does not require that the received packet has a request/acknowledgement characteristic. The received packet can have a code used for error detection, such as a Cyclical Redundancy Check (CRC) code, and the code can be used by the detector 2 to determine whether the received packet is damaged, and a rate of damage can be used as the error rate.

The present invention can be used for detecting the error rate of packets transmitted under a protocol having request/acknowledgement characteristics such as ICMP or ARP packets. With regard to ICMP packets, a utility program such as PING can be used for transmitting an ICMP packet, and the error rate can be computed based on whether the ICMP packet has been acknowledged within a predetermined time period. With regard to ARP packets, the error rate can be computed based on whether an ARP packet has been acknowledged. The error rate thus computed can then be used for adjusting the communications-supporting power of the connection port 10*a* as shown in FIG. 3.

In sum, the device 100 and method for adjusting communications power according to the present invention can ensure quality of data transmission and reception, reduce power consumption, and minimize the transmission errors caused by decreased levels of power consumption.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A method for adjusting a power of a connection port that is linked to a connection target, said method comprising:

presetting first and second communication quality threshold values;

generating an estimated communication quality according to at least one of packets transferred between the connection port and the connection target;

decreasing a communications-supporting power of the connection port by one level when the estimated communication quality is lower than the first communication quality threshold value, wherein the communications-supporting power includes at least one of a transmitting power and a receiving power of the connection port;

increasing the communications-supporting power of the connection port by one level when the estimated communication quality is higher than the second communication quality threshold value; and maintaining a current level of the communications-supporting power of the connection port when the estimated communication quality is neither lower than the first communication quality threshold value nor higher than the second communication quality threshold value.

2. The method of claim 1, further comprising in a connection-establishing step, increasing the communications-supporting power by one level when a number of failures of the connection exceeds a predetermined value within a predetermined interval after the connection is established.

3. The method of claim 1, further comprising:

when a network initialization operation is being performed, a level of the communications-supporting power of the connection port is adjusted to a maximum level; and when the network initialization operation is finished, the level of the communications-supporting power of the connection port is adjusted to a predetermined level associated with a power-saving mode.

4. The method of claim 1, wherein when the estimated communication quality is between the first and the second communication quality threshold values in a predetermined interval, the level of the communications-supporting power of the connection port is kept.

5. The method of claim 1, wherein the estimated communication quality comprises an error rate of packet transmission.

6. The method of claim 5, wherein the error rate is computed as a ratio of an error count to a packet count, the error count being incremented in response to reception of packet information that indicates a packet transmission error, the packet count being incremented in response to packet reception.

7. The method of claim 5, wherein when a received packet has a request/acknowledgment characteristic, the packet count is incremented by one, and the packet information of the received packet is recorded, the packet information including addresses and port numbers of source and destination ends, and a key sequence number.

8. The method of claim 1, wherein the estimated communication quality is computed for packets transmitted from the connection port, and the transmitting power of the connection port is adjusted in accordance with the estimated communication quality.

9. The method of claim 1, wherein the error rate is computed for packets received by the connection port, and the receiving power of the connection port is adjusted in accordance with the error rate.

10. The method of claim 5, wherein when a received packet has a request/acknowledgment characteristic, it is determined whether an acknowledgment for a transmitted packet is received within a predetermined time period, and if the acknowledgement is not received within the predetermined time period, the error count is incremented by one.

11. The method of claim 5, wherein when a received packet has a code used for error detection, the code is used for determining whether the received packet is damaged, and a rate of damage is used as the error rate.

12. A device for adjusting communications power, said device being adapted to connect to a connection port, and comprising:

a reliable link error detecting circuit to receive packet information of packets received and transmitted by the connection port, to generate an estimated communication quality based on said packet information;

to generate an adjustment command according the estimated communication quality and at least one communication quality threshold value, wherein the communications-supporting power of the connection port includes at least one of a transmitting power and a receiving power; and a power-saving controller coupled to said reliable link error detecting circuit to adjust the communications-supporting power of the connection port according to said adjustment command received from said reliable link error detecting circuit.

13. The device of claim 12, further comprising:

Wherein, in a connection-establishing step, said power-saving controller increases the communications-supporting power of the connection port by one level when a number of failures of the connection exceeds a predetermined interval after the connection is established.

14. The device of claim 12, wherein when a network initialization operation is being performed, said power-saving controller adjusts a level of the communications-supporting power of the connection port to a maximum level, and after the network initialization operation is finished, said power-saving controller adjusts the level of the communications-supporting power of the connection port to a predetermined level associated with a power-saving mode.

15. The device of claim 12, wherein said at least one communication quality threshold value comprises first and second communication quality threshold values, and when said estimated communication quality is between the first and the second communication quality threshold values in a predetermined interval, the power-saving controller keeps the level of the communications-supporting power of the connection port.

16. The device of claim 12, wherein the estimated communication quality comprises an error rate of packet transmission.

17. A method for adjusting a communication power comprising the steps of:

providing a predetermined power to a communication port;

using the predetermined power for establishing a connection between the communication port and a connection target over a channel;

using a communications-supporting power for conducting the communication between the communication port and the connection target;

computing an estimated communication quality of the channel between the communication port and the connection target; and determining whether to adjust the communications-supporting power according to the estimated communication quality.

18. The method of claim 17, wherein a level of the communications-supporting power is between a maximum communications-supporting power and a minimum communications-supporting power, and the level of the communications-supporting power before adjustment is performed is a level that is not smaller than the level of the predetermined power.

19. The method of claim 17, wherein the step of using the predetermined power for establishing the connection comprises:

increasing the predetermined power when the connection is not established; and using the increased power as the level of the communications-supporting power.

* * * * *